United States Patent [19]
Sano et al.

[11] Patent Number: 5,121,160
[45] Date of Patent: Jun. 9, 1992

[54] EXPOSURE METHOD AND APPARATUS

[75] Inventors: Naoto Sano, Kunitachi; Masato Aketagawa, Yokohama; Hitoshi Nakano, Kawasaki; Takahisa Shiozawa, Yokohama, all of Japan

[73] Assignee: Canon Kabushiki Kaisha, Tokyo, Japan

[21] Appl. No.: 715,745

[22] Filed: Jun. 18, 1991

Related U.S. Application Data

[63] Continuation of Ser. No. 490,451, Mar. 8, 1990, abandoned.

[30] Foreign Application Priority Data

Mar. 9, 1989 [JP] Japan .................. 1-057498
Mar. 28, 1989 [JP] Japan .................. 1-077059

[51] Int. Cl.5 .............. G03B 27/42; G03B 27/72; G03B 27/32
[52] U.S. Cl. ...................... 355/53; 355/71; 355/77
[58] Field of Search ............ 355/51, 53, 55, 71, 355/77, 68; 350/448, 449, 451; 250/492.3

[56] References Cited

U.S. PATENT DOCUMENTS

| | | | |
|---|---|---|---|
| 4,498,742 | 2/1985 | Uehara | 350/523 |
| 4,688,932 | 8/1987 | Suzuki | 355/51 |
| 4,739,373 | 4/1988 | Nishi et al. | 355/53 |
| 4,773,750 | 9/1988 | Bruning | 353/122 |
| 4,779,943 | 10/1988 | Tatsuno et al. | 350/3.7 |
| 4,780,747 | 10/1988 | Suzuki et al. | 355/68 |
| 4,811,055 | 3/1989 | Hirose | 355/53 |
| 4,851,882 | 7/1989 | Takahashi et al. | 355/46 |
| 4,891,663 | 1/1990 | Hirose | 355/53 |
| 4,936,665 | 6/1990 | Whitney | 350/451 |
| 4,937,619 | 6/1990 | Fukuda et al. | 355/53 |
| 4,954,717 | 9/1990 | Sakamoto et al. | 250/492.3 |
| 4,970,546 | 11/1990 | Suzuki et al. | 355/53 |
| 4,977,426 | 12/1990 | Hirose | 355/53 |
| 4,988,188 | 1/1991 | Ohta | 355/53 X |

FOREIGN PATENT DOCUMENTS

63-113412 5/1988 Japan .

Primary Examiner—Richard A. Wintercorn
Attorney, Agent, or Firm—Fitzpatrick, Cella, Harper & Scinto

[57] ABSTRACT

An exposure method, includes the steps of directing a radiation beam to a substrate to be exposed; and substantially correcting any change in the size of the radiation beam. Also, there is disclosed an exposure apparatus, which includes a laser for emitting a laser beam; a detector for detecting any change in the size of the laser beam; and a device for directing the laser beam to a substrate to be exposed, the directing device including a compensator responsive to an output signal from the detector for substantially correcting the change in the beam size.

34 Claims, 7 Drawing Sheets

EXPOSURE METHOD AND APPARATUS

This application is a continuation of application Ser. No. 07/490,451 filed Mar. 8, 1990, now abandoned.

FIELD OF THE INVENTION AND RELATED ART

This invention relates to an exposure method and apparatus, and more particularly it relates to an exposure method and apparatus using a laser such as an excimer laser, for example, as a light source.

Conventionally, in an exposure apparatus having a laser as a light source, a beam expander or the like is disposed between the laser and an optical system so as to shape a light beam emitted by the laser into one having a predetermined size and being suited to the optical system. As an example, the light beam emitted by an excimer laser has a rectangular sectional shape of about 5×20, which beam can be shaped by a beam and the thus shaped light is supplied to the optical system.

However, it has been found that in this type of laser the diameter or shape of the emitted laser light changes due to degradation of an electrode of a laser resonator or to an instrumental error of individual resonators.

If the diameter or shape of the laser light changes, it is no more possible to supply, to the optical system, such a laser light as having a desired size necessary for the optical system and, therefore, the optical system does not perform satisfactorily.

If, on the other hand, a laser light of a diameter larger than required is supplied to the optical system, a portion of the laser light is shaded by an entrance pupil of the optical system, which leads to a decrease in the efficiency of utilization of the light. This results in prolongation of the time necessary for the exposure and thus in a decrease in the throughput of the apparatus.

SUMMARY OF THE INVENTION

It is accordingly an object of the present invention to provide an exposure method and apparatus by which the above-described inconveniences can be avoided and thus the performance of the exposure apparatus can be improved.

In order to achieve this object, an exposure method according to an aspect of the present invention comprises a step for directing a radiation beam to a substrate to be exposed, and a step for substantially correcting any change in the diameter of the radiation beam. Similarly, an exposure apparatus according to an aspect of the present invention includes means for directing a radiation beam to a substrate to be exposed, and correcting means for substantially correcting any change in the diameter of the radiation beam.

In an exposure apparatus according to one preferred form of the present invention, there are provided a laser which emits a substantially parallel laser beam, means for directing the laser beam to a substrate to be exposed, and a compensator for substantially correcting any change in the diameter of the laser beam.

In an exposure apparatus according to another preferred form of the present invention, there are provided a laser for emitting a laser beam, a detector for detecting any change in the diameter of the laser beam, directing means for directing the laser beam to a substrate to be exposed, and a compensator for substantially correcting any change in the diameter of the laser beam in response to an output signal from the detector.

An exposure apparatus according to one preferred form of the present invention includes a laser for emitting a laser beam, a detector for detecting any change in the diameter of the laser beam, an illumination optical system for illuminating a mask supported by a first stage with the laser beam, a projection optical system for projecting an image of a pattern of the mask, illuminated by the illumination optical system, onto a wafer supported by a second stage, and a compensator for substantially correcting any change in the diameter of the laser beam in response to an output signal of the detector.

As the detector to be provided in the exposure apparatus of the present invention, many varieties of optical sensors or other types of sensors may be used. When used, the sensor may be provided to detect any change in the diameter of the laser beam directly or indirectly. As the compensator of the exposure apparatus, preferably an optical means may be used which means comprises, for example, a movable optical component such as a lens or mirror, or it may comprise a deformable plate member. Alternatively, it may comprise a lens element whose refracting power is variable. As an example of such optical means, in an embodiment to be described later, a variable-magnification optical system comprising a lens assembly is used.

With the features of the present invention described above, a radiation beam of a suitable size can always be supplied to the optical system. As a result, the optical system can sufficiently exhibit its performance and, therefore, superior exposure of a substrate to be exposed, such as a wafer, is ensured. Also, there is no possibility of a decrease in the efficiency of utilization of the light.

The present invention is applicable not only to an exposure method and apparatus wherein the exposure is made by use of a laser beam, as described, but also to other exposure methods and apparatus adapted to be used with various radiation beams such as other light beams or X-ray beams.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
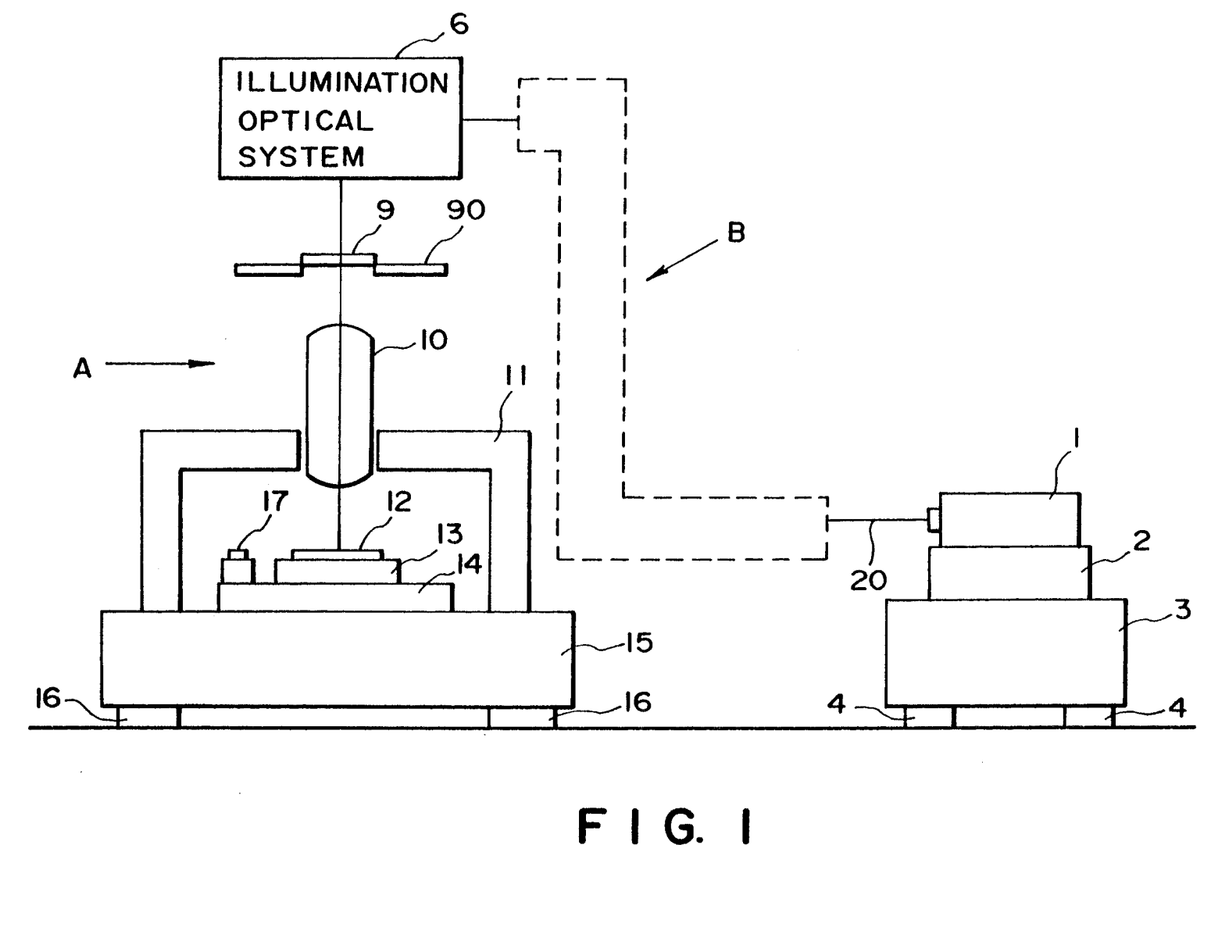
FIG. 1 is a schematic view of an exposure apparatus according to one embodiment of the present invention.

Referring to FIG. 1 which is a schematic view of an exposure apparatus according to one embodiment of the present invention, denoted at A is a main assembly of the exposure apparatus which includes an exposure optical system (6, 10). Denoted at 1 is a KrF excimer laser adapted to emit a laser light of a wavelength $\lambda = 248.4$ nm. The excimer laser is fixedly mounted onto a movable X-Y-$\theta$ stage 2 which is provided on a laser surface plate 3. The laser 1 is provided with a bandwidth narrowing means, such that a laser beam of narrow bandwidth can be supplied from the laser 1. Denoted at B is a transmission system for transmitting the laser light 20 from the laser 1 to an illumination optical system 6 of the exposure apparatus main assembly A, and it is constituted by plural optical components. Details of this transmission system B will be described later. Denoted at 6 is the illumination optical system as mentioned above; at 9 is a reticle (mask) on which a circuit pattern for manufacture of semiconductor devices is formed; at 90 is a reticle holder; at 10 is a reduction projection lens system for projecting the circuit pattern of the reticle 9 in a reduced scale of 1/5; at 11 is a lens supporting table; at 12 is a semiconductor wafer (substance to be exposed); at 13 is a chuck for holding the wafer 12 by attraction; at 14 is a movable X-Y-$\theta$ stage; at 15 is a stepper surface plate; and at 16 is a vibration-preventing cushion means. The laser light 20 emitted from the excimer laser 1 passes through the transmission system B and enters into the illumination optical system 6 of the exposure apparatus main assembly A. After passing through the illumination optical system 6, the reticle 9 and the projection lens system 10, the light impinges on the wafer 12. The exposure optical system comprising the illumination optical system 6 and the projection lens system 10, is fixed in an integral structure by means of the lens supporting table 11 which is fixed to the stepper surface plate 15. For this reason, the relative position of the optical systems (6, 10) within the exposure apparatus main assembly A is substantially unchangeable. Also, the transmission system B is fixed to the exposure apparatus main assembly A. As described hereinbefore, the reticle 9 has a circuit pattern formed thereon. By illuminating the reticle 9 through the illumination optical system 6 and with the laser light, an image of the circuit pattern, being reduced in a scale of 1/5, is projected and transferred to the wafer 12 through the projection lens system 10.

Each of the X-Y-$\theta$ stages 2 and 14 is movable translationally and rotationally in a plane perpendicular to the optical axis of the projection lens system 10. The X-Y-$\theta$ stage 2 can operate to position the laser 1 as desired, while the X-Y-$\theta$ stage 14 can operate to position the wafer 12 as desired. The system which includes the exposure apparatus main assembly A and the transmission system B, is physically separated from the system (1, 2, 3, 4) including the laser 1.

The wafer 12 is attracted by vacuum to the wafer chuck 13 which is fixed to the movable X-Y-$\theta$ stage 14 provided on the stepper surface plate 15. By means of the X-Y-$\theta$ stage 14, the wafer 12 can be displaced in two orthogonal X and Y directions, such that the pattern reduced by the projection lens system 10 can be transferred to a desired site (shot area) on the wafer.

Usually, in order to transfer the reduced pattern to several tens shot areas arrayed on the wafer 12, each time the X-Y-$\theta$ stage 14 is moved in the X or Y direction the laser light is projected to the reticle 9 for pattern transfer, and such operation is repeated.

Denoted at 17 is an illuminomitor having a photodetector fixedly mounted to the X-Y-$\theta$ stage 14. By driving the X-Y-$\theta$ stage 14, this illuminomitor 17 can be positioned in an image surface in the field of view of the projection lens system 10 for measurement of the illuminance at the image surface of the projection lens system 10. The illuminance as measured by this illuminomitor 17 is considered as the illuminance on the wafer 12 surface and is used as control data for control of the amount of exposure during the exposure operation.

Figure 2:
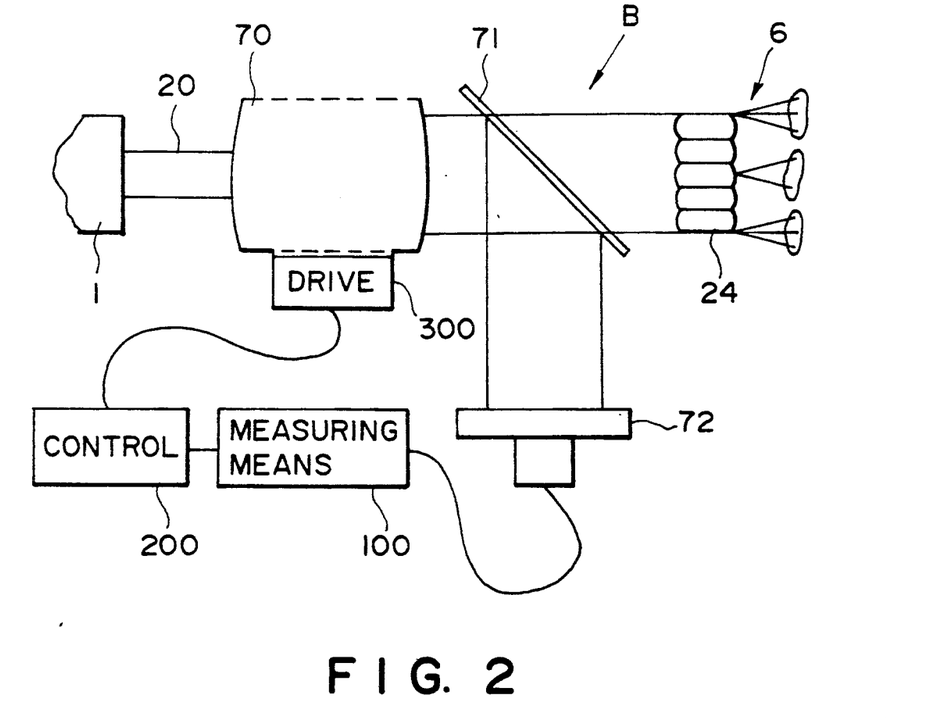
FIG. 2 is a schematic view of a part of a transmission system B shown in FIG. 1.

FIG. 2 illustrates the structure of a part of the transmission system B of the FIG. 1 exposure apparatus.

In FIG. 2, denoted at 70 is a variable-magnification optical system which has a function for changing the diameter of a laser light emitted from the laser 1. Denoted at 71 is a half mirror (beam splitter) disposed with inclination on the path of the laser beam passed through the variable-magnification optical system. The half mirror serves to amplitude-divide the received laser light and to reflect a portion thereof while transmitting the remaining portion. Denoted at 24 is an optical integrator which constitutes a part of the illumination optical system 6. The optical integrator 24 includes a plurality of bar-like lenses each having spherical end faces. These bar-like lenses are arrayed in parallel to each other, along a plane perpendicular to the optical axis 5 of the illumination optical system 6. The optical integrator 24 receives the laser light passed through the half mirror 71 and serves to form a plurality of secondary light sources corresponding to the number of the bar-like lenses. The reticle 9 shown in FIG. 1 is illuminated with the laser beams from these secondary light sources. Denoted at 72 is a photoreceptor (photodetector) comprising a CCD or the like and serves to receive the laser light reflected by the half mirror 71 and to produce a signal corresponding to the beam (sectional) shape and the intensity distribution of the received laser light. As illustrated, since the half mirror 71 is provided with inclination so as to intersect the whole of the laser light emanating from the variable-magnification optical system 70, the beam diameter on the light receiving surface of the photoreceptor 72 is proportional to the beam diameter of the laser light emanating from the variable-magnification optical system 70 (in FIG. 2 the former exactly corresponds to the latter).

Denoted at 100 is a measuring means for measuring the beam diameter (or any change thereof) of the laser light emanating from the variable-magnification optical system 70, on the basis of output signals from the photoreceptor 72 corresponding to the edge position of the light beam upon the light receiving surface thereof or the beam diameter on the light receiving surface. The result of measurement is inputted to a control means 200. In accordance with the input from the measuring means 100, the control means 200 supplies an instruction signal to a driving means 300 for the variable-magnification optical system 70, to cause the driving means 300 to drive the variable-magnification optical system 70 to thereby adjust the beam diameter of the laser beam to be emitted therefrom, to a desired diameter having been predetermined. In the present embodiment, the magnification of the variable-magnification optical system 70 is controlled under the influence of the half mirror 71, the photoreceptor 72, the measuring means 100, the control means 200 and the driving means 300 so that the beam diameter of the laser light emitted from the variable-magnification optical system 70 becomes approximately equal to the diameter of the optical integrator 24. Therefore, even if the beam diameter of the laser light emitting from the laser 1 changes due to a factor such as a change with time of the laser 1, it is possible that laser light of a constant diameter is always supplied to the optical integrator 24 (illumination optical system 6). As a result, the illumination optical system 6 performs satisfactorily to thereby improve the performance of the exposure apparatus. If, on the other hand, the diameter of the laser light inputted to the optical integrator 24 becomes larger than a predetermined diameter, a portion of the light is shaded by the optical integrator 24. Such a problem does not arise in the exposure apparatus of the present embodiment.

As seen from FIG. 2, the laser light emitted from the laser 1 is parallel light which is parallel to the optical axis of the illumination optical system 6 and, in the form of this parallel light, it is directed to the optical integrator 24. Since the diameter of the optical integrator 24 is larger than the beam diameter of the laser light emitted from the laser 1, the laser light is projected to the optical integrator 24 with its beam diameter being expanded. Thus, the variable-magnification optical system 70 of the present embodiment constitutes an afocal optical system and has a function as a beam expander.

Figure 4:
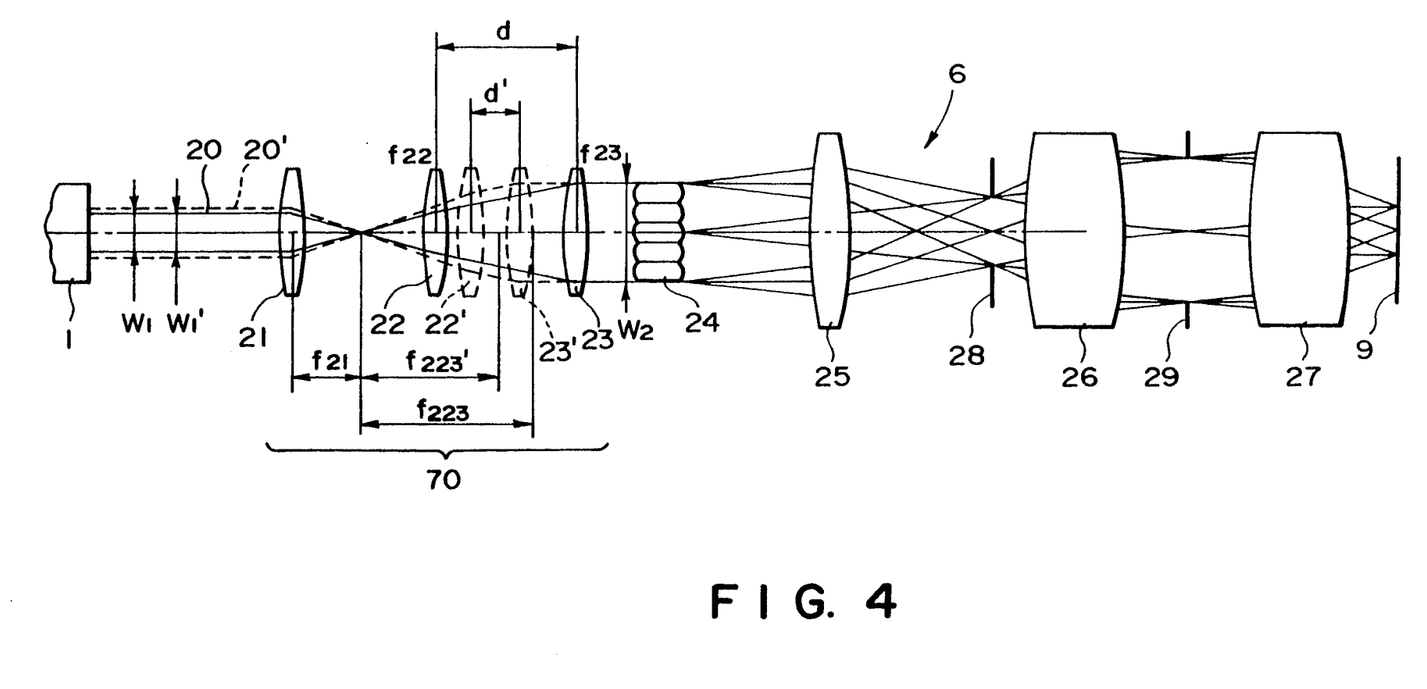
FIGS. 4-8 are schematic illustrations, respectively, each showing an embodiment of a variable-magnification optical system.
Figure 5:
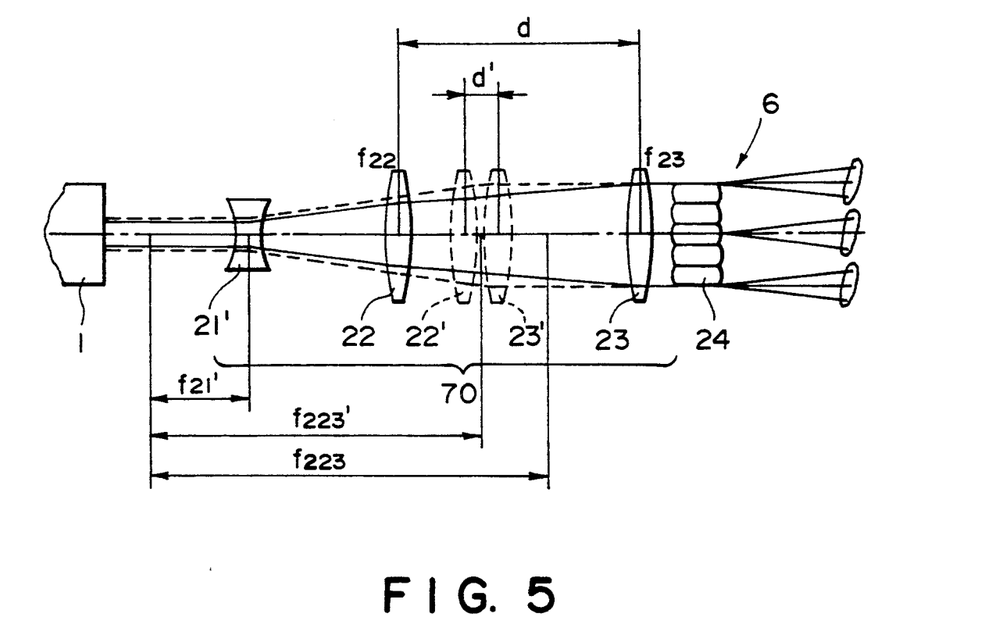

The variable-magnification optical system 70 can be provided by combining plural lenses and, by displacing some of these lenses, the magnification can be changed. In accordance with the magnification, the beam diameter of the laser light changes. Displacement of the lenses for such magnification control is made by the driving means 300. Referring now to FIGS. 4 and 5, an example of specific structure of the variable-magnification optical system 70 will be explained.

FIG. 4 is a schematic view of an optical arrangement to be provided between the laser 1 and the reticle 9 shown in FIG. 1. Reference will now be made to FIG. 4, to explain an example of structure of the variable-magnification optical system usable in the present embodiment.

In FIG. 4, the elements corresponding to those illustrated in FIG. 2 are denoted by the same numerals. Reference numerals 21, 22 (22′) and 23 (23′) in the drawing denote those lenses constituting the variable-magnification optical system 70. The lenses 22 and 23 are displaceable along the optical axis. Numerals 25, 26 and 27 denote those lenses constituting the illumination optical system 6 and, by these lenses to, the lights from the plural secondary light sources as formed by the optical integrator 24 are superposed one upon another on the reticle 9. This provides a uniform illuminance distribution on the reticle 9 surface. Denoted at 28 is a field stop which is a member, usually called in an exposure apparatus as a "masking blade", adapted to restrict a zone of the reticle 9 to be illuminated. The field stop 28 is placed at a position which is optically conjugate with the reticle 9 with respect to the lenses 26 and 27. Denoted at 29 is an aperture stop which serves to determine the numerical aperture (NA) of the illumination optical system 6 at the light exit side (reticle 9 side). The aperture stop 29 is placed at a position which is optically conjugate with the light emitting surface of the optical integrator 24 with respect to the lenses 25 and 26.

Details of the variable-magnification optical system 70 will be explained.

The lenses 21–23 are so disposed that the focal point position of the lens 21 at the light exit side coincides with the light entrance side focal point position of a combined system consisting of the lenses 22 and 23. Here, when the focal lengths of the lenses to are denoted by $f_{21}$, $f_{22}$ and $f_{23}$ and when the distance between the principal points of the lenses 22 and 23 is denoted by d, then the composite focal length $f_{223}$ of the lenses 22 and 23 is represented by:

$$1/f_{223} = 1/f_{22} + 1/f_{23} - d/(f_{22} \times f_{23}) \qquad (1)$$

Here, the magnification $\beta$ of the variable-magnification optical system 70, provided by the lenses to, is represented by:

$$\beta = f_{223}/f_{21} \qquad (2)$$
$$= 1/\{[1/f_{22} + 1/f_{23} - d/(f_{22} \times f_{23})] \times f_{21}\}$$

Thus, by changing the interval d between the principal points of the lenses 22 and 23, the magnification $\beta$ can be changed.

When, in FIG. 4, the size of the parallel laser light 20 emitted from the laser 1 (i.e., the diameter thereof being within the sheet of the drawing) is denoted by $W_1$ and when the size of the light necessary for the illumination optical system 6 is denoted by $W_2$, then the interval d between the principal points of the lenses 22 and 23 of the variable-magnification optical system 70 can be determined by substituting $\beta = W_2/W_1$ into equation (2), in the following manner:

$$d = f_{22} + f_{23} - (W_1/W_2) \times (f_{22} f_{23})/f_{21} \qquad (3)$$

Also, when the size of the laser light 20 changes from $W_1$ to $W_1'$, similarly the interval d′ between the principal points can be detected by substituting $\beta = W_2/W_1'$ into equation (2), as follows:

$$d' = f_{22} + f_{23} - (W_1'/W_2) \times (f_{22} \times f_{23})/f_{21} \qquad (4)$$

Accordingly, by displacing the lenses 22 and 23 so as to change the distance between the principal points of the lenses 22 and 23 from d to d′, the size $W_2$ necessary for the illumination optical system is attainable.

It should be noted here that both the lenses 22 and 23 should be displaced so that the exit side focal point position of the lens 21 coincides with the entrance side focal point position of the combined system of the lenses 22 and 23, such that parallel laser light can always be emitted from the variable-magnification optical system 70.

In FIG. 4, the variable-magnification optical system 70 is illustrated as of a type having three positive lenses adapted to once form a point of convergence of the light on the path of the laser light. However, it is possible to provide a variable-magnification optical system 70 of a type in which no point of convergence of the light is formed on the path of the laser beam.

FIG. 5 is an explanatory view, illustrating an example of such type of variable-magnification optical system. In place of the lens 21 of FIG. 4, a convex lens (negative lens) 21′ is provided. As illustrated, the variable-magnification optical system 70 of the present embodiment serves to direct the laser light to the optical integrator 24, without focusing it. Also, in the present embodiment, by displacing the lenses 22 and 23 along the optical axis, the magnification of the variable-magnification optical system 70 is changed, whereby the optical integrator 24 can be illuminated with a laser light of a desired size.

As for a variable-magnification optical system usable in the present invention, various forms are adoptable in accordance with the sectional shape and size (beam diameter) of the laser light emitted from a laser and with the sectional shape and size (beam diameter) of the laser light necessary for the illumination optical system. Although illustrated in FIGS. 4 and 5 is the variable-magnification optical system 70 which uses ordinary type rotationally symmetrical lenses, it is of course possible to form a variable-magnification optical system having an anamorphic optical system that includes a cylindrical lens. In this Specification, such a variable-magnification optical system of the type shown in FIGS. 4 and 5 and having an expanding function will be called a "zoom expander" while, on the other hand, such a variable-magnification optical system having an expanding function but having a simplex magnification changing function for changing by use of a cylindrical lens the beam diameter of a laser light only in one of two orthogonal directions (vertical and horizontal directions) in the sectional plane of the laser light, will be called a "cylindrical zoom expander".

Figure 6:
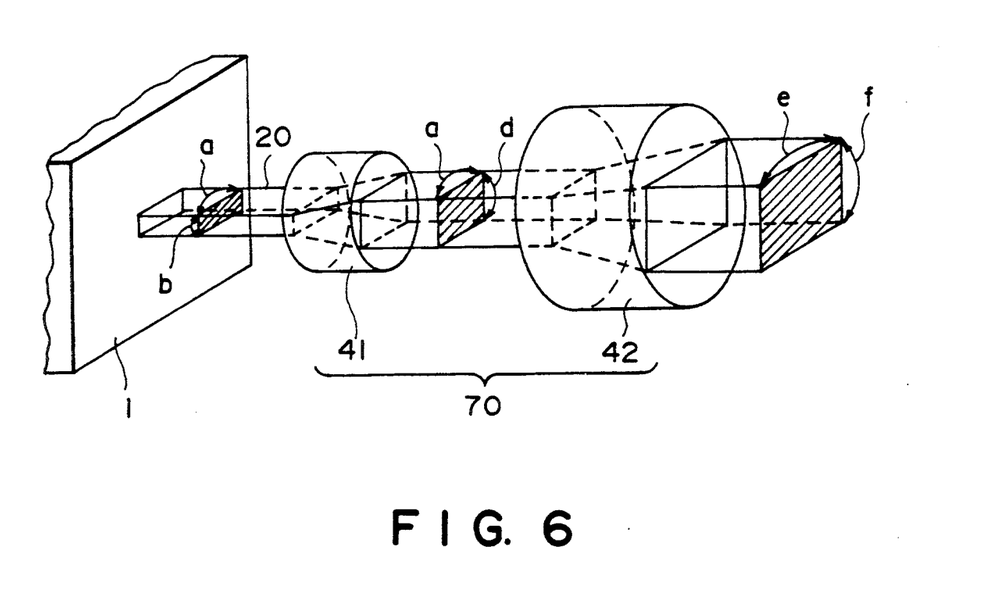
Figure 7:
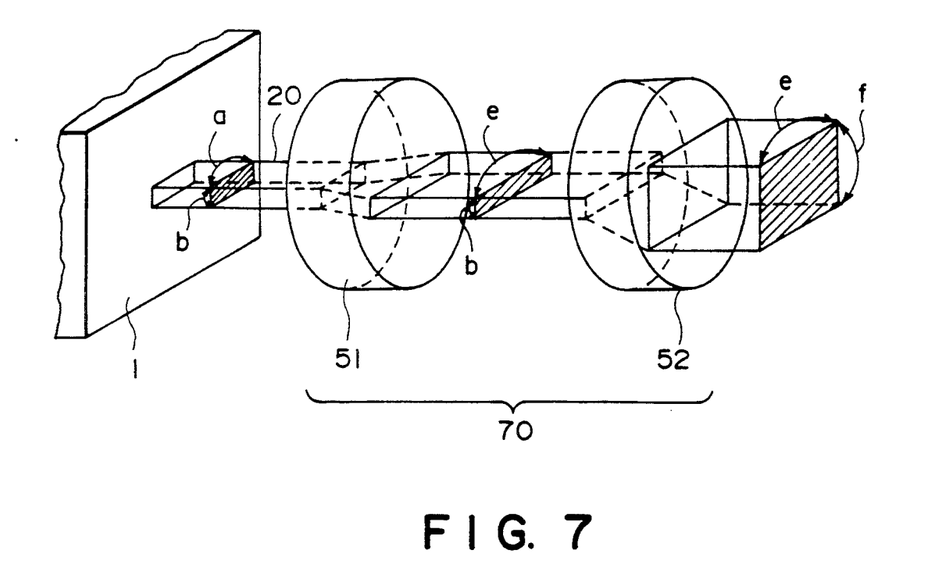
Figure 8:
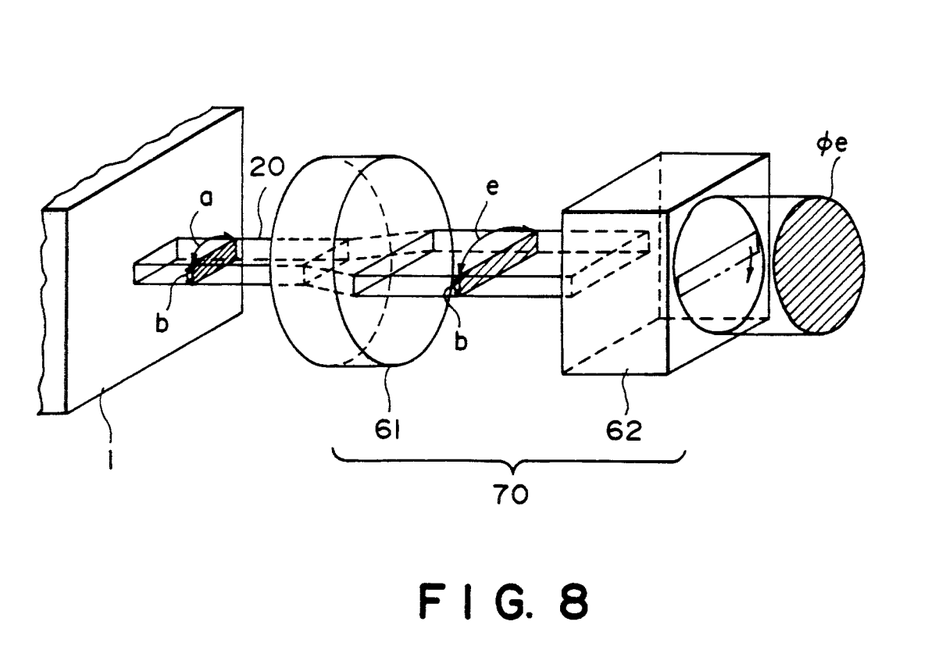

FIGS. 6–8 are explanatory views showing example of a variable-magnification optical system having such a cylindrical zoom expander. In each embodiment illustrated, the variable-magnification optical system 70 is provided by a plurality of variable-magnification optical systems. Also, from the excimer laser 1 shown in FIG. 1, a parallel laser light which is rectangular in cross-section is emitted and, in these embodiments, description will be made with respect to a variable-magnification optical system adapted to change the beam dimensions of a laser light having such a rectangular cross-section. (It is noted that in this specification the term "diameter" may be used to refer generically to dimensions of the beam cross-section even though it is not circular.)

In FIG. 6, a parallel laser light 20 emitted from a laser 1 and having a size "a×b" is transformed into a parallel laser light of a size "a×d" by means of a cylindrical zoom expander 41 (first variable-magnification optical system) adapted to change only the magnification with respect to the vertical direction. The shape of the laser light of the size "a×d" is analogous to the sectional shape of a laser light of a size "e×f" as required for the illumination optical system.

Then, by means of a beam expander 42 (second variable-magnification optical system) having the same magnification with respect to the vertical and horizontal directions, the laser light of the size "a×d" is transformed into a laser light of a size "e×f" required for the illumination optical system, and it is supplied to the illumination optical system which is not shown. With the provision of the cylindrical zoom expander 41 and the zoom expander 42 in the path of the laser light 20, if any change in shape or size of the laser light 20 emitted from the laser 1 or any instrumental error is produced notably in the vertical direction, for example, by changing only the magnification of the cylindrical zoom expander 41, it is easily possible to adjust the laser light 20 emitted from the laser 1 into one having a shape and a size as required for the illumination optical system. It is to be noted that both the zoom expanders 41 and 42 provide an afocal optical system. Further, the positions of the cylindrical zoom expander 41 and the zoom expander 42 may be reversed, with a similar effect.

FIG. 7 illustrates the arrangement of a variable-magnification optical system which is effective particularly when any change with time of the sectional shape (beam diameter) of the laser light 20 emitted from the laser 1 or any instrumental error is present with respect to each of the vertical and horizontal directions and also when there is a difference in quantity between the variations in the vertical and horizontal directions. In FIG. 7, two cylindrical zoom expanders 51 and 52 (i.e. first and second variable-magnification optical systems) are adapted to change the magnification with respect to mutually different, vertical and horizontal directions, respectively (each in one direction).

In the present embodiment, the cylindrical zoom expander 51 is arranged to change as desired the magnification only with respect to the horizontal direction, while the cylindrical zoom expander 52 is arranged to change as desired the magnification only with respect to the vertical direction. Both the zoom expanders 51 and 52 provide an afocal optical system. Accordingly, a parallel laser light of a size "a×b" emitted from the laser 1 is transformed into a laser light of a size "e×b" by the cylindrical zoom expander 51, and the parallel laser light of the size "e×b" is transformed by the cylindrical zoom expander 52 into a laser light of a size "e×f" which in turn is directed to an illumination optical system, not shown. The variable-magnification optical system 70 of the present embodiment also provides an advantageous effect similar to that of the optical system shown in FIG. 6.

FIG. 8 shows a variable-magnification optical system 70 comprising a combination of a cylindrical zoom expander 61 and an image rotating prism 62. The cylindrical zoom expander 61 is capable of changing the magnification only with respect to the horizontal direction. The image rotating prism 62 is rotatable about an axis of rotation lying on the optical axis, under the influence of a driving mechanism (not shown), to thereby rotate an inputted light. As a result, when the inputted light has an asymmetrical sectional intensity distribution, it is possible to make the intensity distribution symmetrical and, therefore, to make the intensity distribution uniform.

In the present embodiment, a parallel laser light 20 of a size "a×b" emitted from a laser 11 is received by the cylindrical zoom expander 61, by which the size in the horizontal direction is converted into a size "e" as required for the illumination optical system, such that a laser light of a size "b×e" is produced. This parallel laser light is inputted to the image rotating prism 62 and, as the prism 62 rotates, it is shaped into a laser light having a substantially circular cross-section of a diameter $\phi e$.

Also, in FIG. 8, the positions of the cylindrical zoom expander 61 and the image rotating prism 62 may be reversed or, alternatively, the cylindrical zoom expander 14 may be replaced by a zoom expander having the same magnification with respect to the vertical and horizontal directions. In any case, an optical system that exhibits substantially the same effect as of the variable-magnification optical system 70 shown in FIG. 8 is obtainable.

As a matter of course, the structure in which an image rotating prism is incorporated into the variable-magnification optical system 70 as a part thereof, can provide a similar advantageous effect as does the optical system shown in FIG. 6 or 7.

Although some examples of a variable-magnification optical system usable in the present invention have been described with reference to FIGS. 4–8, it is easy for a person skilled in the art to design conveniently a different type of optical system, other than those as illustrated. Accordingly, the structure of the variable-magnification optical system is not limited to the disclosed optical systems.

Figure 3:
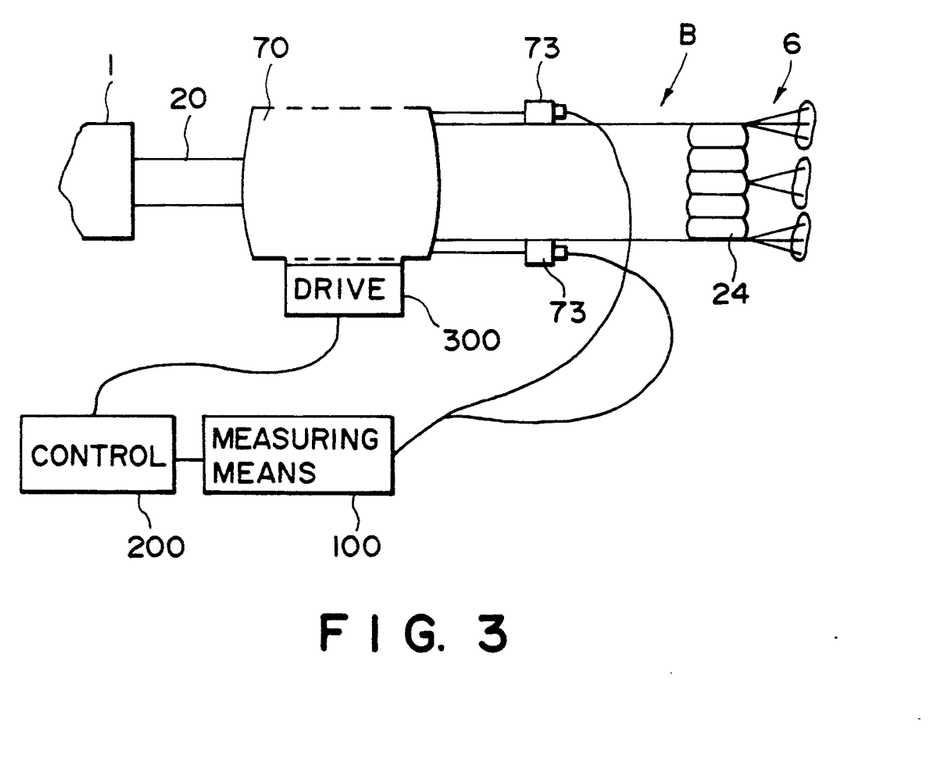
FIG. 3 is a schematic view, illustrating a modified form of the FIG. 2 embodiment.

FIG. 3 is a schematic view showing a modified form of the FIG. 2 embodiment. In the FIG. 2 embodiment, a portion of the laser light emitted from the variable-magnification optical system 70 is detected by use of the half mirror 71 and the photoreceptor 72. As compared therewith, in the embodiment shown in FIG. 3, photoreceptor means 73 are disposed at a part of the laser light emitted from the variable-magnification optical system 70 to detect a portion of the laser light. As illustrated in the drawing, the photoreceptor means 73 are provided to receive those rays near the outer peripheral part of the laser light. These rays are those which can not inherently be received by the optical integrator 24. If the beam diameter of the laser light emitted from the variable-magnification optical system 70 changes, the energy density of the laser light (the photo-energy per unit area) changes and, as a result, the level (magnitude) of the output signal from the photoreceptor means 73 changes. Accordingly, through the measuring means 100, it is possible to measure the beam diameter of the laser light on the basis of the output signal from the photoreceptor means 73. The remaining part of the operation of the present embodiment is similar to that of the FIG. 2 embodiment as described hereinbefore, and description thereof will be omitted here. Clearly, in the present embodiment, an advantageous effect similar to that of the FIG. 2 embodiment is obtainable.

Although in the exposure apparatus shown in FIGS. 1–3, the variable-magnification optical system 70 is incorporated into the transmission system B, if no transmission system B is used, it may be annexed to the illumination optical system 6 of FIG. 1. Also, although FIGS. 2 and 3 illustrate detecting means (71, 72, 100; 73, 100) for detecting a change in the beam diameter of the laser light as well as adjusting means (70, 200, 300) for adjusting the beam diameter of the laser light, within the scope of the present invention it is possible to provide various other types of detecting means and adjusting means.

Next, some methods usable in exposing a wafer 12 by use of the exposure apparatus shown in any one of FIGS. 1-3, will be explained briefly.

Initially, the wafer 12 is attracted to the wafer chuck 13 and, as the wafer 12 is being placed on the X-Y-$\theta$ stage 14, the wafer 12 is displaced to a position which is out of the region of irradiation, to be irradiated with the laser light through the reduction projection lens system 10. This action is carried out by displacing the X-Y-$\theta$ stage 14 through a predetermined amount. Then, the KrF excimer laser 1 is energized so that a laser light is emitted from the KrF excimer laser 1. The beam diameter of the laser light at this time is detected by the detecting means (71, 72, 100; 73, 100) shown in FIG. 2 or 3, and if the detected diameter is deviates from a preset beam diameter, the adjusting means (70, 200, 300) is operated automatically in the manner as described hereinbefore (although it may be operated manually) to adjust the beam diameter of the laser light into the preset beam diameter. After the adjustment is completed, the energization of the KrF laser 1 is once intercepted, and the X-Y-$\theta$ stage 14 is displaced so as to position the wafer 12 in the region of irradiation to be irradiated with the laser light. Then, the exposure of the wafer 12 is initiated.

In the described method, the wafer 12 is retracted out of the region of irradiation by the laser light, when the beam diameter of the laser is going to be detected. However, it is a possible alternative to use a shutter means for control of the amount of exposure, being provided within the illumination optical system 6, in place of retracting the wafer 12. More particularly, as the shutter is closed to prohibit the laser light from being directed to the reticle 9, namely, to the wafer 12 and, in such state, the above-described detection and adjustment may be carried out. In this occasion, after completion of the adjustment, the shutter is opened to start the exposure operation. As a result, it is not necessary to once interrupt the energization of the KrF excimer laser 1.

If during exposure the beam diameter of the laser light changes considerably, after such a change is detected the energization of the KrF excimer laser 1 is stopped or, alternatively, the shutter is closed. Then, the above-described detecting and adjusting operation is performed and, thereafter, the exposure operation is resumed. If, on the other hand, the change in the beam diameter is relatively small but correction thereof is necessary, the detecting and adjusting operation may be made while continuing the exposure operation, to shape the laser light into a desired beam diameter.

Since, as described hereinbefore, any change in the beam diameter of the laser light is detected and, on the basis of the result of detection, the beam diameter of the laser light is adjusted into a preset and desired diameter. As a result, a laser light of an appropriate size can always be supplied to an optical system. Accordingly, the optical system can exhibit proper performance and satisfactory exposure of a wafer can be made. Additionally, since it is possible to avoid any decrease in the efficiency of utilization of light due to any change in the beam diameter, it is possible to reduce the exposure time.

The embodiments having been described in the foregoing are based on the reduction projection exposure apparatus as illustrated in FIG. 1. However, the exposure method and apparatus of the present invention is not limited to this type of apparatus but is applicable also be various types of exposure apparatus such as contact type, proximity type, laser drawing type and a unit-magnification or reduction projection exposure type that uses a reflection type projection system. Also, as a laser to be used for the exposure, any one of various lasers other than the excimer laser may be used. Accordingly, it is easy for a person skilled in the art to adopt the exposure method and apparatus of the present invention in a manner other than those described with reference to the preferred embodiments disclosed in this Specification and the drawings attached hereto, on the basis of the disclosure made therein.

Figure 9:
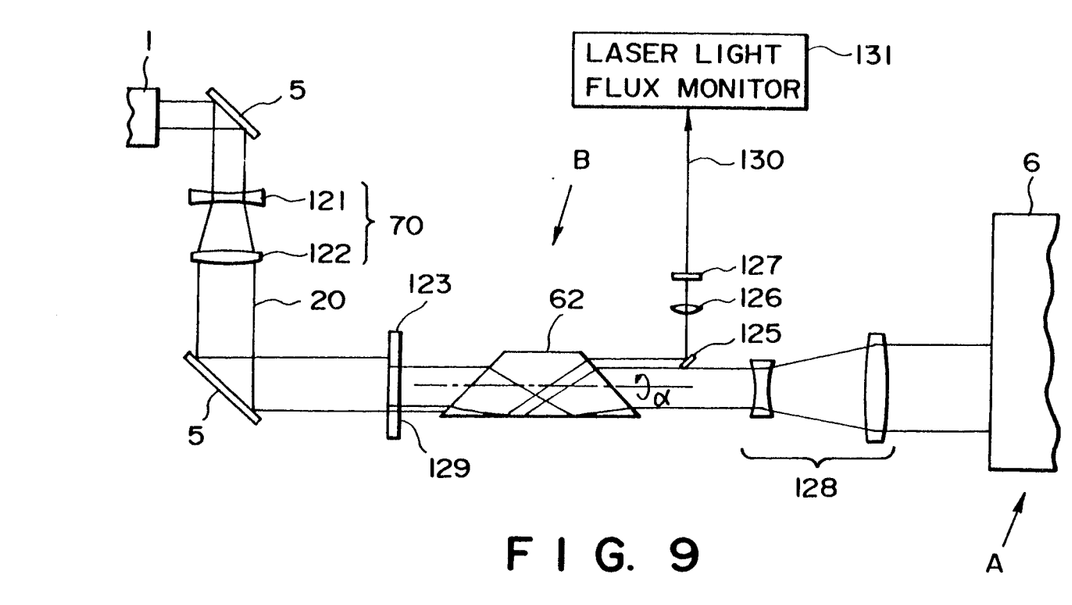
FIG. 9 is a schematic view illustrating another modified embodiment of the present invention.
Figure 10:
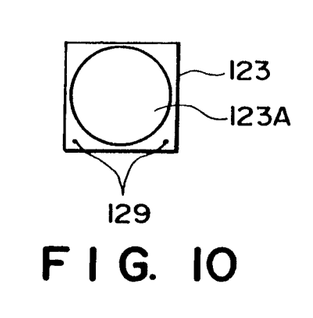
FIG. 10 is a top plan view showing details of a light shaping member used in the FIG. 9 embodiment.

FIG. 9 is a schematic view, illustrating another modified form of the transmission system shown in FIG. 2. In FIG. 9, illustration of the control means 200 and the driving means 300 is omitted. Also, in FIG. 9, the elements corresponding to those shown in FIG. 2 are denoted by the same reference numerals. Denoted in FIG. 9 at 121 is a concave lens system and at 122 is a convex lens system. The lens systems 121 and 122 cooperate to provide an anamorphic beam expander system 70. Denoted at 123 is a light beam shaping member having a circular opening (light transmitting portion). As shown in FIG. 10, two pinholes 129 are formed at predetermined positions adjacent to the light transmitting portion 123A of the light shaping member 123. Denoted at 62 is an image rotating prism which receives a laser light having a circular cross-sectional shape, passed through the circular opening 123A of the light shaping member 123. The image rotating prism 62 is provided to be rotatable (as denoted by an arrow α in the drawing) about an axis of rotation lying on the optical axis of the transmission system B, under the influence of a rotating mechanism (not shown). Denoted at 125 is a small reflection mirror disposed to receive, through the image rotating prism 62, the laser light passed through a pinhole 129 of the light shaping member 123. The reflection mirror 125 serves to reflect the laser light from a pinhole 129 toward a condensing lens 126. The condensing lens 126 serves to collect the reflected laser light upon a line sensor 127. The photoelectrically converted signal from the line sensor 127 is applied through a signal line 130 to a laser light monitoring means 131. Denoted at 128 is a beam expander system which receives the laser light passed through the circular opening 123A of the light shaping member 123 and the image rotating prism 124. After expanding the beam diameter of the received laser light, the beam expander system 128 directs the light to an illumination optical system 6 of an exposure apparatus main assembly A.

The laser light emitted from an excimer laser 1 is reflected by a reflection mirror 5 and is inputted into the beam expander system 70 which comprises the concave lens system 121 and the convex lens system 122. The cross-sectional shape of the laser light from the excimer laser 1 is determined in accordance with the shape of a discharging portion of the laser 1, and it is rectangular. In the present embodiment, in order to transform the cross-sectional shape (rectangular) of the laser light into an approximately square shape, each of the concave lens system 121 and the convex lens system 122 is formed by use of a toric lens, so as to provide an anamorphic beam expander system 70. Therefore, the laser light passed through this beam expander system 70 has an approximately square cross-sectional shape.

The laser light from the beam expander system 70 is reflected by another reflection mirror 5 and is inputted to the light beam shaping member 123. The diameter of the circular opening 123A of the light shaping member 123 is set to be smaller than the length of each side of the square cross-section of the laser light to be received, and both the center of the circular opening 123A and the center of the laser light lie on the optical axis of the transmission system B. Accordingly, under the influence of the circular opening 123A of the light shaping member 123, the cross-sectional shape of the laser light is transformed into a circular shape and, additionally, such portion of the laser light close to the center thereof, in which the power density is relatively uniform, can be extracted. On the other hand, a part of the laser light which is incident on the portion around the circular opening 123A of the light shaping member 123 and which otherwise should be blocked by a light-intercepting portion of the light shaping member 123 passes through either one of the two pinholes 129. The laser light passed through the circular opening 123A of the light shaping member 123 as well as the two laser lights passed through the two pinholes 29 are inputted to the image rotating prism 124 by which the laser light passed through the circular opening 123A is directed to a beam expander system 128 while the two laser lights passed through the pinholes 129 are directed to the reflection mirror 125.

Figure 11:
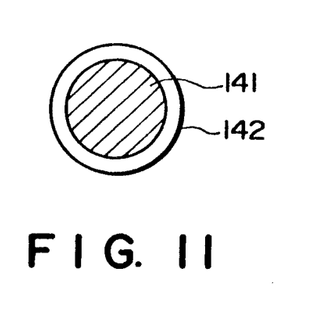
FIG. 11 is a schematic view, illustrating a laser beam emanating from an image rotating prism used in the FIG. 9 embodiment.

As the image rotating prism 62 rotates under the influence of the rotating mechanism mentioned above, the laser light passed through the circular opening 123A as well as the two laser lights passed through the pinholes 129 are rotated. When these laser lights are viewed from the light exit side of the image rotating prism 124, what as illustrated in FIG. 11 is obtained. In FIG. 11, numeral 141 denotes the cross-section of the laser light passed through the circular opening 123A of the light shaping member 123, and numeral 141 denotes the locus of the two laser lights passed through the pinholes 129. As the image rotating prism 124 rotates, as illustrated in FIG. 11 the two laser lights passed through the pinholes 129 rotate with a ring-like locus. In consideration thereof, the reflection mirror 125 is disposed at a predetermined site on the locus (path) of the two rotating laser lights so that it can reflect the two laser lights at the same time. Also, in order that the two laser lights have the same locus, in the present embodiment the two pinholes are formed at the positions spaced by the same distance from the center of the circular opening 123A of the light shaping member 123.

The provision of a rotatable, image-rotating prism on the path of the laser light in the present embodiment is to make uniform the sectional intensity distribution of the laser light passed through the circular opening 123A of the light shaping member 123, to be used for the exposure. Namely, although it is possible to obtain a laser light having a relatively uniform power density by extracting the portion of the laser light from the laser 1 which is close to the center thereof, the sectional intensity distribution of the laser light is not completely uniform. More particularly, since the laser light emitted from the excimer laser 1 has an intensity distribution which is asymmetrical with respect to the optical axis, at least it is necessary to make such intensity distribution symmetrical with respect to the optical axis. In consideration thereof, the laser light passed through the circular opening 123A of the light shaping member 123 is inputted to the image rotating prism 124 and, by rotating the image rotating prism 124 about the optical axis, the laser light is rotated about the optical axis so as to provide a laser light having a substantially uniform cross-sectional intensity distribution which is symmetrical with respect to the optical axis. Accordingly, in the exposure apparatus shown in FIG. 1, when the wafer 12 is exposed with the laser light, the image rotating prism 124 is rotated, by which a laser light having substantially uniform cross-sectional intensity distribution is expanded and directed to the reticle 9 by the illumination optical system 6.

Figure 12A:
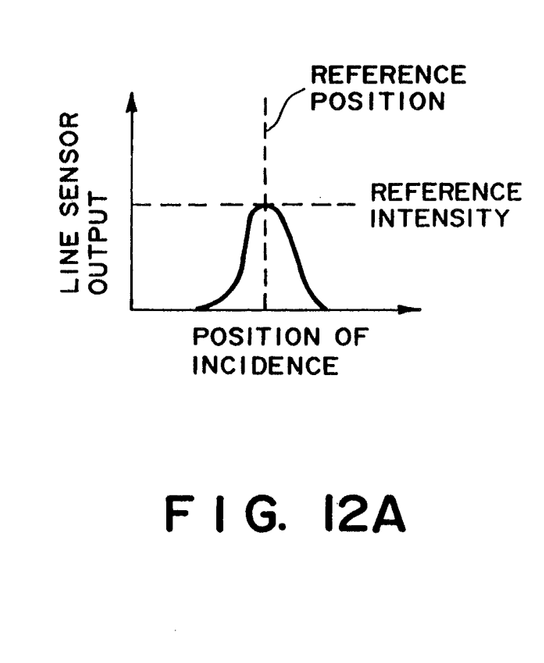
FIGS. 12A-12C are graphs, showing examples of an output from a line sensor used in the FIG. 9 embodiment.
Figure 12B:
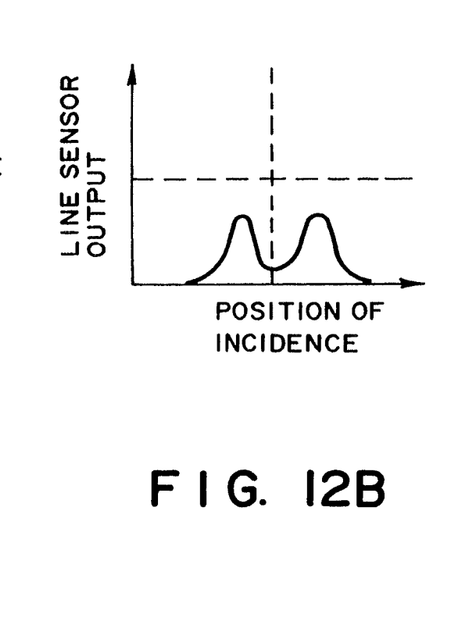
Figure 12C:
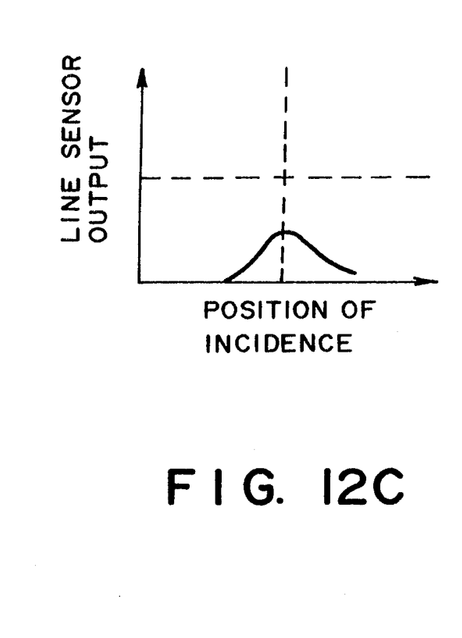

On the other hand, the two laser lights from the pinholes 129 and incident on the reflection mirror 125 are reflected by the reflection mirror 125 and, through the condensing lens 126 they are focused on the line sensor 127, respectively. The laser light emanating from the laser 1 is a parallel light or a light divergent (or convergent) with a predetermined small angle, and the anamorphic beam expander system 70 is arranged into an afocal system so as not only to expand this laser light but also to emit it in the form of a parallel light Accordingly, as long as the laser 1 is operating normally, the laser light inputted to the light shaping member 123 is a parallel light and, similarly, each of the laser lights passed through the circular opening 123A of the light shaping member 123, through corresponding ones of the pinholes 129 and through the image rotating prism 124, is a parallel light In the present embodiment, the positional relationship of the line sensor 127 and the condensing lens 126 is set so that the light receiving surface of the line sensor 127 is positioned at the focal point position of the condensing lens 126. Also, the condensing lens 126 receives the two laser lights reflected by the reflection mirror 125, each being a parallel light. Therefore, as long as the laser 1 is being operating normally and the respective components (5, 121, 122, 123 and 62) have been set correctly, the two laser lights are focused by the condensing lens 126 upon the same position on the light receiving surface of the line sensor 127. FIG. 12A shows the illuminance distribution on the light receiving surface of the line sensor 127, in this state. In FIG. 12A, the illuminance distribution on the light receiving surface of the line sensor 127 is depicted in the relationship of the output level of the line sensor 127 (the axis of the ordinate) versus the position of incidence of the laser light upon the light receiving surface (the axis of the abscissa). Also, as described hereinbefore, the output signal of the line sensor 127 is inputted through the signal line 130 to the laser light flux monitor means 131. In the present embodiment, a memory in the laser light monitor means 131 has memorized therein the maximum illuminance upon the light receiving surface of the line sensor 127 (the peak value of the output signal from the line sensor 127) and the position on the light receiving surface representing the maximum illuminance (the position of the peak of the output signal), in the state shown in FIG. 12A, in the form of a reference intensity and a reference position, respectively. By detecting respective deviations of a peak value and a peak position of an output signal from the line sensor 127, with respect to the memorized reference intensity and reference position, any change in the beam diameter of the laser light and/or any change in the angle of expansion (the degree of parallelism) of the laser light is monitored. As an example, if the angle of expansion of the laser light inputted to the light shaping member 123 increases with a change in the operating characteristic of the laser 1 or with a change in the set position of each component (5, 21 or 22), the angle of incidence of the laser light inputted to the two pinholes 129 changes. As a result, the output signal from the line sensor 127 changes, such as illustrated in FIG. 12B, for example. Also, if because of a similar factor the beam diameter of the laser light inputted to the light shaping member 123 increases (provided that the output of the laser is constant and the laser light is maintained in the form of a parallel light), the intensity of the laser light inputted to the pinholes decreases, with a result that the output signal of the line sensor 127 changes such as illustrated in FIG. 12C, for example.

With the described arrangement wherein the laser light extracted by the pinholes 129 formed adjacent to the circular opening 123A of the light shaping member 123, for shaping the sectional shape of the laser light, is detected by use of the line sensor utilization of the laser light for exposure of the wafer 12. As a result, it is possible to reduce the beam diameter or the angle of divergence, for example, of the laser light can be monitored continuously through the laser light monitor means 131, it is possible to detect any change in the beam diameter or the angle of divergence of the laser light supplied to the illumination optical system 6 and to execute automatic correction of the detected change, as desired. Particularly, in an occasion where as in the present embodiment a laser 1 and an exposure apparatus main assembly A are placed on separate base members and a laser light from the laser is introduced to the exposure apparatus main assembly A through a transmission system B having a relatively long optical path, the transmission system B must be set very precisely. In consideration thereof, use of the output signal of the line sensor for adjustment or the like of the transmission system B is an effective measure. Further, since any change in the operating characteristics of the laser 1 itself is detectable, there is an advantage that abnormality of the laser 1 can be detected at an early stage.

In the present embodiment, in order to introduce the laser light of the laser 1 to the exposure apparatus main assembly A more efficiently, all the lenses (121, 122 and 128) constituting the transmission system B as well as the image rotating prism 62 are made of $SiO_2$. Also, the lens elements of the illumination optical system 6 and the projection lens system 10 of the exposure apparatus main assembly A are made of a glass material or materials, such as $SiO_2$, having a good transmission factor with respect to the laser light.

In FIG. 9, the reflection mirror 125 serves to reflect, at the same time, the laser lights from the two pinholes 129 toward the condensing lens 126. However, the size of the reflection mirror 125 may be reduced and the arrangement may be modified so that the laser lights from the two pinholes 129 can be reflected sequentially by the reflection mirror 125 toward the condensing lens 126, such that they can be received by the line sensor 127 alternately. Further, while the light beam shaping member 123 has a function for transmitting the laser light with use of its circular opening 123A, in place of using such a circular opening 123A an elliptical reflection surface may be formed on a non-transparent substrate to provide a reflection type light beam shaping member. In that event, the elliptical reflection surface may operate to reflect the portion of the inputted laser light close to the center thereof, and a laser light of a circular cross-sectional shape may be directed to the illumination optical system 6 while, on the other hand, a laser light from at least one pinhole provided adjacent to the reflection surface may be directed to the line sensor 126. As an example, the reflection type light shaping member may be disposed with inclination at the position of the reflection mirror 5 provided between the beam expander system 70 and the image rotating laser light to the image rotating prism 62. Then, the laser light passed through the pinhole of the light shaping member can be collected directly by the condensing lens and it can be directed to a photodetector such as a line sensor, for example. Accordingly, it is not necessary to use a reflection mirror, such as at 125 in FIG. 9, for bending the light path.

On the other hand, by slightly modifying the structure of FIG. 9, use of the reflection mirror 125 and the condensing lens 126 can be omitted. More specifically, a two-dimensional sensor array such as a CCD, for example, may be provided between the light shaping member 123 and the image rotating prism 62 so that the laser light from the pinhole 129 of the light shaping member 123 can directly be received by the two-dimensional sensor array, without being directed to the image rotating prism 62, and the output of the sensor array may be inputted to the laser light monitor means 131.

In any one of the structures described hereinbefore, a similar effect as of the exposure apparatus shown in FIGS. 1 and 9 is obtainable, and any one of the structures can be applied not only to an exposure apparatus of a type wherein a circuit pattern of a reticle is projected to a wafer through a projection lens system (as shown in FIG. 1) but also to various other types of exposure apparatus, including a type wherein a substance to be exposed is scanned with a laser light to form a pattern thereon.

In some embodiments described hereinbefore, a line sensor or a two-dimensional sensor array is used as a photodetector for detecting any change in the beam diameter of a laser light or any change in the angle of divergence thereof. However, the present invention is not limited to use of a photodetector only for such purpose. As an example, the laser light from a pinhole of a light beam shaping member may be received by a photoelectric converting element and an output signal of the photoelectric converting element may be applied to an integration exposure meter for control of the amount of exposure. Also, in that occasion, such a laser light which is to be shaded by the light shaping member and not to be directed to an illumination optical system is detected and, therefore, it is possible to improve the efficiency of utilization of the laser light for the exposure.

Further, in place of forming a pinhole in a light beam shaping member to direct a laser light to a photodetector, a minute reflection surface may be formed at a particular site adjacent to an aperture of the light shaping member, and with the reflection by such minute reflection surface a portion of the laser photodetector.

With the provision of a light extracting portion in the neighborhood of a light transmitting portion of a light shaping member, for introducing to a photodetector a portion of a laser light inputted to a part of the light shaping member adjacent to the light transmitting portion thereof, it is possible to direct to the photodetector an unwanted light which inherently is not transmitted to a substance to be exposed, such as a wafer, without a necessity of using a beam splitter or the like which otherwise might be disposed with inclination on the path of the laser light. As a result, it is possible to provide an exposure apparatus having an improved efficiency of utilization of the laser light. This makes it possible to reduce the exposure time for exposure of a substance to be exposed, and the exposure apparatus can have a high throughput.

As the basic structure of the beam expander 70 shown in FIG. 9, a variable-magnification optical system such as described with reference to FIG. 5 is applicable. In other words, by forming each of the lenses 21', 22 and 23 with use of a cylindrical lens, the anamorphic beam expander 70 shown in FIG. 9 is obtainable. Here, some lenses included in the convex lens system 122 may be displaceable along the optical axis and, on the basis of an output signal from the monitor means 131 corresponding to the change in the beam diameter of the laser light and through a control means and a driving means (both not shown), the position of each lens with respect to the direction of the optical axis may be controlled. This operation is essentially the same as that having been described with reference to the embodiment shown in FIGS. 1 and 2.

In place of arranging the beam expander 70 into a variable-magnification optical system as described in the foregoing, the beam expander 128 may be structured into a variable-magnification optical system and, by using this beam expander 128, any change in the beam diameter of the laser light may be corrected.

Further, it is not always necessary to provide an optical element such as a lens, for correcting a change in the beam diameter of the laser light, as a component of an afocal optical system or a beam expander as in the embodiments described hereinbefore, and such a correcting optical element may conveniently be provided at an appropriate position on the path of the laser light.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
    a laser for emitting a laser beam;
    a detector for detecting any change in size of the laser beam; and
    means for directing the laser beam to a substrate, said directing means including an optical integrator, for receiving the laser beam and producing a plurality of secondary light sources, and a compensator disposed between said laser and said optical integrator and being responsive to an output signal from said detector, for substantially correcting a change in size of the laser beam upon the optical integrator.

2. An apparatus according to claim 1, wherein said laser comprises a pulsed laser.

3. An apparatus according to claim 2, wherein said laser comprises an excimer laser.

4. An apparatus according to claim 1, wherein said compensator includes a movable lens which is displaceable along an optical axis of said directing means, and wherein through displacement of said movable lens the change in size of the laser beam can be corrected.

5. An apparatus according to claim 4, wherein said directing means includes an afocal optical system arranged to expand the size of the laser beam and having a movable lens which is said movable lens, and wherein said afocal optical system is arranged so that, independently of the displacement of said movable lens, a substantially parallel laser beam is emitted therefrom.

6. An apparatus according to claim 5, wherein said detector is adapted to detect any change in the size of the laser beam emitted from said afocal optical system.

7. An exposure apparatus, comprising:
    a radiation source for providing a radiation beam; and
    means for directing the radiation beam from said source to a substrate, said directing means including (a) a generator for receiving the radiation beam and producing a plurality of secondary radiation sources and (b) means for substantially correcting a change in size of the radiation beam received by the generator.

8. An apparatus according to claim 7, wherein said directing means includes an optical system having a predetermined lens element and wherein said correcting means is operable to displace said predetermined lens element along an optical axis of said optical system, to thereby substantially correct the change in the size of the beam.

9. An apparatus according to claim 8, wherein said radiation source includes a laser, wherein said generator includes an optical integrator, wherein said directing means further includes a lens system for directing laser beams from said secondary radiation sources to the substrate, and wherein said optical system is provided between said laser and said optical integrator.

10. An apparatus according to claim 8, wherein said correcting means includes a photoelectric converter for receiving a portion of the laser beam and for producing a signal corresponding the beam size of the laser beam, and driving means responsive to the output signal of said converter to displace said lens element.

11. An apparatus according to claim 8, wherein said optical system comprises an afocal system and wherein said optical system is arranged so that, independently of the displacement of said lens element, a substantially parallel laser beam is emitted therefrom.

12. An apparatus according to claim 11, wherein said optical system includes a cylindrical lens.

13. An apparatus according to claim 11, wherein said optical system includes an image rotator.

14. An apparatus according to claim 9, wherein said laser comprises an excimer laser.

15. An exposure apparatus, comprising:
a first stage for supporting a mask;
a second stage for supporting a wafer;
an excimer laser for emitting a laser beam;
a detector for detecting a change in size of the laser beam;
an illumination optical system for illuminating a mask supported by said first stage with the laser beam, said illumination optical system including (a) an optical integrator for receiving the laser beam to produce a plurality of secondary light sources, (b) a lens system for directing laser beams from said secondary light sources to the mask, and (c) a transmission optical system for transmitting the laser beam from said excimer laser to said optical integrator, said transmission optical system having a compensator responsive to an output signal from said detector to substantially correct a change in size of the laser beam received by said optical integrator; and
a projection optical system for projecting an image of a pattern of the mask, illuminated by said illumination optical system, to a wafer supported by a second stage.

16. An apparatus according to claim 15, further comprising a movable third stage on which said laser is mounted.

17. An apparatus according to claim 15, wherein said transmission optical system includes an afocal optical system and wherein said compensator is provided in said afocal optical system.

18. An apparatus according to claim 17, wherein said compensator comprises a lens element which is displaceable along an optical axis of said afocal optical system.

19. An apparatus according to claim 17, wherein said laser is adapted to supply a substantially collimated laser beam and wherein said afocal optical system includes a beam expander for receiving a substantially collimated laser beam and for expanding the size thereof.

20. An apparatus according to claim 19, wherein said afocal optical system includes first and second beam expanders and wherein said first beam expander is effective to expand the size of a received laser beam with respect to a first direction.

21. An apparatus according to claim 20, wherein said second beam expander is effective to expand the size of a received laser beam with respect to a second direction perpendicular to said first direction.

22. An apparatus according to claim 19, wherein said afocal optical system includes an image rotator.

23. An apparatus according to claim 19, wherein said afocal optical system includes an anamorphic optical system and wherein said compensator is provided in said anamorphic optical system.

24. An apparatus according to claim 17, wherein said detector includes a photoelectric converter adapted to receive a portion of the laser beam to produce a signal corresponding to a change in the size of the laser beam.

25. An apparatus according to claim 24, wherein said transmission optical system includes a member having a predetermined opening, for controlling the cross-sectional shape of the laser beam, wherein through said opening the laser beam is directed to said optical integrator, wherein said member has a light extracting portion formed at a site other than that of said opening, and wherein said detector is provided so that a laser beam obtainable through said light extracting portion is received by said photoelectric converter.

26. An apparatus according to claim 24, wherein said detector is provided so that the laser beam emitted from said afocal optical system is received by said photoelectric converter.

27. An apparatus according to claim 15, further comprising control means for receiving an output signal from said detector, for controlling said compensator in accordance with the received output signal, wherein said control means is operable to stop illumination of the mask with the laser beam, on the basis of an output signal from said detector.

28. In an exposure method, for manufacture of semiconductor devices, for projecting a radiation beam to an optical integrator to produce a plurality of secondary radiating sources and for exposing a wafer to a circuit pattern with radiation beams from said secondary radiation sources, the improvement comprising the steps of:
detecting a change in size of the radiation beam impinging on the optical integrator; and
compensating for the change in size of the radiation beam on the basis of the detection;
wherein, after the compensation, exposure of the wafer is effected.

29. A method according to claim 28, wherein the radiation beam is supplied by an excimer laser.

30. A method according to claim 28, wherein, for the exposure of the wafer, an image of the circuit pattern is projected on the wafer with radiation beams from the secondary radiation sources.

31. A method according to claim 28, wherein a lens system is provided in a path of the radiation beam and wherein, for compensation of the change in size of the radiation beam, the lens system is adjusted.

32. A method according to claim 31, wherein the lens system comprises a zoom lens.

33. A method according to claim 32, wherein the radiation beam is supplied by an excimer laser.

34. A method according to claim 32, wherein, for the exposure of the wafer, an image of the circuit pattern is projected on the wafer with radiation beams from the secondary radiation sources.

* * * * *

UNITED STATES PATENT AND TRADEMARK OFFICE
CERTIFICATE OF CORRECTION

PATENT NO. : 5,121,160

DATED : June 9, 1992

INVENTOR(S) : NAOTO SANO, ET AL.

It is certified that error appears in the above-identified patent and that said Letters Patent is hereby corrected as shown below:

COLUMN 1

Line 20, "a beam and" should read --a beam expander into a certain size of about 20-50 square and--.

COLUMN 4

Line 29, "5" should be deleted.

COLUMN 5

Line 50, "lenses to," should read --lenses 25-27--.

COLUMN 6

Line 5, "lenses to" should read --lenses 21-23--.

Line 14, "lenses to," should read --lenses 21-23,--.

Line 34, "$d=f_{22}+f_{23}-(W_1/W_2)X(f_{22}f_{23})/f_{21}$" should read --$d=f_{22}+f_{23}-(W_1/W_2)X(f_{22}xf_{23})/f_{21}$--.

COLUMN 9

Line 64, "is" should be deleted.

UNITED STATES PATENT AND TRADEMARK OFFICE
CERTIFICATE OF CORRECTION

PATENT NO. : 5,121,160

DATED : June 9, 1992

INVENTOR(S) : NAOTO SANO, ET AL.

It is certified that error appears in the above-identified patent and that said Letters Patent is hereby corrected as shown below:

COLUMN 10

Line 20, "once" should be deleted.

Line 50, "be" should read --to--.

COLUMN 12

Line 67, "light" should read --light.--.

COLUMN 13

Line 6, "light" should read --light.--.

Line 63, "line sensor utilization" should read --line sensor 127, it is possible to increase the efficiency of utilization--.

Line 65, "the beam" should read --the exposure time for exposure of the wafer 12. Since the beam--.

UNITED STATES PATENT AND TRADEMARK OFFICE
CERTIFICATE OF CORRECTION

PATENT NO. :     5,121,160

DATED      :     June 9, 1992

INVENTOR(S) :    NAOTO SANO, ET AL.

It is certified that error appears in the above-identified patent and that said Letters Patent is hereby corrected as shown below:

COLUMN 14

Line 52, "rotating laser" should read --rotating prism 62 (Figure 9), so as to reflect the received laser--.

COLUMN 15

Line 36, "laser photodetector." should read --laser light may be extracted and directed to the photodetector.--

Signed and Sealed this

Tenth Day of August, 1993

Attest:

MICHAEL K. KIRK

Attesting Officer

Acting Commissioner of Patents and Trademarks